(12) United States Patent
Guo (10) Patent No.: US 9,689,909 B2
(45) Date of Patent: Jun. 27, 2017

(54) SYSTEM FOR ANALYZING AND LOCATING PARTIAL DISCHARGES

(71) Applicant: UTILX Corporation, Kent, WA (US)

(72) Inventor: Jun Guo, Issaquah, WA (US)

(73) Assignee: CableWISE Techimp Limited, London (GB)

( * ) Notice: Subject to any disclaimer, the term of this patent is extended or adjusted under 35 U.S.C. 154(b) by 994 days.

(21) Appl. No.: 13/737,786

(22) Filed: Jan. 9, 2013

(65) Prior Publication Data

US 2013/0179100 A1   Jul. 11, 2013

Related U.S. Application Data

(60) Provisional application No. 61/585,572, filed on Jan. 11, 2012.

(51) Int. Cl.
   *G01R 31/02* (2006.01)
   *G06F 17/00* (2006.01)
   (Continued)

(52) U.S. Cl.
   CPC ....... *G01R 31/021* (2013.01); *G01R 31/1227* (2013.01); *G06F 17/00* (2013.01); *G01R 31/088* (2013.01)

(58) Field of Classification Search
   USPC .......................................................... 702/59
   See application file for complete search history.

(56) References Cited

U.S. PATENT DOCUMENTS

| 5,642,038 A | 6/1997 | Kim |
| 5,869,959 A | 2/1999 | Tomikawa |

(Continued)

FOREIGN PATENT DOCUMENTS

| EP | 0555491 B1 | 9/1992 |
| KR | 10-0206662 B1 | 7/1999 |
| KR | 10-0851038 B1 | 8/2008 |

OTHER PUBLICATIONS

A. Cavallini, A Novel Method to Locate PD in Polymeric Cable Systems Based on Amplitude-frequency (AF) Map, 2007 IEEE, pp. 726-734.*

(Continued)

*Primary Examiner* — Tung Lau
(74) *Attorney, Agent, or Firm* — Christensen O'Connor Johnson Kindness PLLC; Jadran Mihailovic; John Denkenberger (57) ABSTRACT

A sensor detects partial discharges (PDs) in an electrical power system and generates a corresponding analog electrical signal. A data acquisition component receives the signal from the sensor and converts it to digitized zero span data for a series of uniformly spaced frequencies in a frequency spectrum of interest. A digital signal processing component receives the digitized zero span data, analyzes such data, and generates a corresponding phase resolved spectrum signal in three dimensional format including dimensions of amplitude, phase and frequency for each of the uniformly spaced frequencies. A display component receives the analyzed data stream from the processing component and actuates one or more displays from which characteristics of the PD can be identified, such as different types of PDs from different sources, and information on the location of a PD relative to the sensor.

11 Claims, 6 Drawing Sheets

(51) Int. Cl.
*G01R 31/12* (2006.01)
*G01R 31/08* (2006.01)

(56) References Cited

U.S. PATENT DOCUMENTS

| | | | |
|---|---|---|---|
| 6,809,523 | B1 | 10/2004 | Ahmed |
| 7,676,333 | B2 | 3/2010 | Younsi |
| 2009/0119035 | A1 | 5/2009 | Younsi |
| 2011/0012586 | A1 | 1/2011 | Montanari |

OTHER PUBLICATIONS

F. H. Kreuger, Cl assi fic at ion of Part i al Discharges, IEEE Transactions on Electrical Insulation vol. 28 No. 6, Dec. 1993, p. 917-931.*

Kyaw-Soe Lwin, Off-Line PD Diagnosis for Stator Winding of Rotating Machines Using a UWB Sensor, Journal of Electrical Engineering & Technology, vol. 3, No. 2, pp. 263-269, 2008.*

Denis Denissov, Wide and narrow band PD detection in plug-in cable connectors in the UHF range, 2008 International Conference on Condition Monitoring and Diagnosis, Beijing, China, Apr. 21-24, 2008, 4 pages.*

Th. Heizmann, On-Site Partial Discharge Measurements on Premoulded Cross-Bonding Joints of .170 kV XLPE and EPR Cables, IEEE Transactions on Power Delivery, vol. 13, No. 2, Apr. 1998, p. 330-335.*

Canxin Guo, Issue 12, vol. 7, Dec. 2008 in DSP Based On-line Partial Discharge Monitoring System for High Voltage Power Cable, 10 pages.*

Si Wenrong in Przeglad Elektrotechniczny (Electrical Review), ISSN 0033-2097, R. 87 NR Oct. 2011, title Study on time-frequency extractors for partial discharge pulse current used in sequence grouping and identification , 10 pages.*

O. Perpiñán, Aug. 21, 2012, Signal analysis and feature generation for pattern identi_cation of partial discharges in high-voltage equipment, 38 pages.*

Wong Jee Keen Raymond, PLOS One I DOI:10.1371/journal.pone. 0170111 Jan. 13, 2017, in Classification of Partial Discharge Measured under Different Levels of Noise Contamination , 20 pages.*

Boggs, S., "The Case for Frequency Domain PD Testing in the Context of Distribution Cable," IEEE Electrical Insulation Magazine 19(4):13-19, Jul./Aug. 2003.

Boggs, S.A., and G.C. Stone, "Fundamental Limitations in the Measurement of Corona and Partial Discharge," IEEE Transactions on Electrical Insulation EI-17(2):43-150, Apr. 1982.

Chiu, S.L., "Fuzzy Model Identification Based on Cluster Estimation," Journal of Intelligent and Fuzzy Systems 2(3):267-278, Sep. 1994.

Guo, J.J., and S.A. Boggs, "High Frequency Signal Propagation in Solid Dielectric Tape Shielded Power Cables," IEEE Transactions on Power Delivery 26(3):1793-1802, Jul. 2011.

International Search Report and Written Opinion mailed Apr. 25, 2013, issued in corresponding International Application No. PCT/US2013/020830, filed Jan. 9, 2013, 10 pages.

Meijer, S., et al., "Digital Analysis of Multiple Faults in GIS," Conference Record of the IEEE International Symposium on Electrical Insulation, Arlington, VA., Jun. 7-10, 1998, pp. 69-73.

Oussalah, N., et al., "Partial Discharge Pulse Propagation in Shielded Power Cable and Implications for Detection Sensitivity," IEEE Electrical Insulation Magazine 23(6):5-10, Nov./Dec. 2007.

Steiner, J.P., et al., "Estimating the Location of Partial Discharges in Cables," IEEE Transactions on Electrical Insulation 27(1):44-59, Feb. 1992.

Stone, G.C., and S.A. Boggs, "Propagation of Partial Discharge Pulses in Shielded Power Cable," Annual Report of the Conference on Electrical Insulation and Dielectric Phenomena, Amherst, Mass., Oct. 17-21, 1982, pp. 275-280.

"Subclust," MATLAB Help Document, "Subtractive Clustering," MATLAB R2011b (7.13.0.564), 2011, 4 pages.

Tian, Y., et al., "Partial Discharge Detection in Cables Using VHF Capacitive Couplers," IEEE Transactions on Dielectrics and Electrical Insulation 10(2):343-353, Apr. 2003.

"Spectrum Analyzer Measurements and Noise, Application Note 1303: Measuring Noise and Noise-Like Digital Communications Signals With a Spectrum Analyzer," Hewlett-Packard Company, 1998, 32 pages.

Australian Patent Examination Report No. 1 mailed May 18, 2016, in AU Application No. 2013208101, filed Jan. 9, 2013, 4 pages.

* cited by examiner

SYSTEM FOR ANALYZING AND LOCATING PARTIAL DISCHARGES

CROSS-REFERENCE TO RELATED APPLICATION

This application claims the benefit of U.S. Provisional Application No. 61/585,572, filed on Jan. 11, 2012, which is hereby expressly incorporated by reference herein.

BACKGROUND

As electrical systems age, defects such as cavities inside of insulating materials, thinning of insulation in motor and transformer windings, contamination across insulating surfaces, incorrect voltage to ground spacing, and so on, can begin to discharge. The presence of these electrical discharges is an indicator of hidden defects which, if left unattended, can lead to system failure. In fact, the discharges themselves will, over time, degrade the material that is sustaining them also leading to system failure. Because these discharges may occur within the interior of an insulating material and because these discharge events can be very small in absolute magnitude, their presence can be unnoticeable to human senses.

A partial discharge (PD) is a flow of electrons and ions which occurs in a gas over a small volume of the total insulation system. The defects concentrate the electric stress and can degrade the dielectric. The degradation initiates within a limited portion of the dielectric and typically does not lead to acute failure immediately. Instead, the PD in an insulation system performs as a chronic symptom which develops and eventually causes failure. The characteristics of a PD are "health indicators" which represent the performance of the insulation system in an electrical apparatus. Attempts to detect, analyze, and locate PDs have been made for a long time, including systems designed to measure and analyze acoustic energy emitted by PD pulses, optical energy emitted by PD pulses, and/or electromagnetic energy emitted by PD pulses. In electromagnetic detection systems, induction coupled (magnetic) sensors and capacitive coupled (electrical) sensors have been used to detect the PD pulses and pass a corresponding PD signal to analyzing equipment.

In electromagnetic terms, a PD pulse is characterized by a fast rise time in the range of sub-nanoseconds (sub-ns) and a signal bandwidth up to the gigahertz (GHz) range at its origin. The initial ns or sub-ns spike is followed by an "ionic portion," which may have a longer duration (about 100 ns). In a shielded power cable, the PD signal propagates along the power cable from its origin, but high frequency components of the signal attenuate more significantly (i.e., over shorter distances) than lower frequency components.

Known systems have attempted to characterize and locate PD sources by analyzing the PD signals in the time domain (such as an oscilloscope providing an output of detected amplitude as a function of time) or in the frequency domain (such as a spectrum analyzer providing an output of signal magnitude as a function of frequency in a spectrum). Aspects of such systems are described in:

"Estimating the Location of Partial Discharges in Cables," *IEEE Transactions on Electrical Insulation*, Vol. 27, No. 1, February 1992;

"The Case for Frequency Domain PD Testing in the Context of Distribution Cable," *IEEE Electrical Insulation Magazine*, Vol. 19, No. 4, July/August 2003; and the references cited therein.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect of the system of the present invention, a sensor detects partial discharges (PDs) in an electrical system receiving power at a characteristic power frequency, and converts the detected PDs to digital zero span data for each of several frequencies in a frequency range of interest. In one embodiment, the range of interest can be at least 100 MHz and the frequencies of interest can be spaced no more than 5 MHz apart. After de-noising, the digital zero span data is sorted to obtain a phase resolved spectrum signal which can be used to actuate a display formatted in three dimensions (amplitude, phase, and frequency) for each of the several frequencies in the range of interest. The sorted data can be used to identify different characteristics of discharges detected by the sensor, such as by identifying different types of discharges that recur each power cycle and discharges originating at different distances from the sensor. Distance information can be particularly important to locate the source of a PD in a long power cable.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

A partial discharge (PD) analyzing system in accordance with the present invention can be used to evaluate the insulation condition in power equipment such as power transformers, motors/generators, switchgears, and power cables, each of which receives electric power at a characteristic power frequency. Particularly in the case of power cables, an important advantage of the system in accordance with the present invention is its use for locating the origin of a PD source along the cable, in addition to providing information on other characteristics of the PD.

Figure 1:
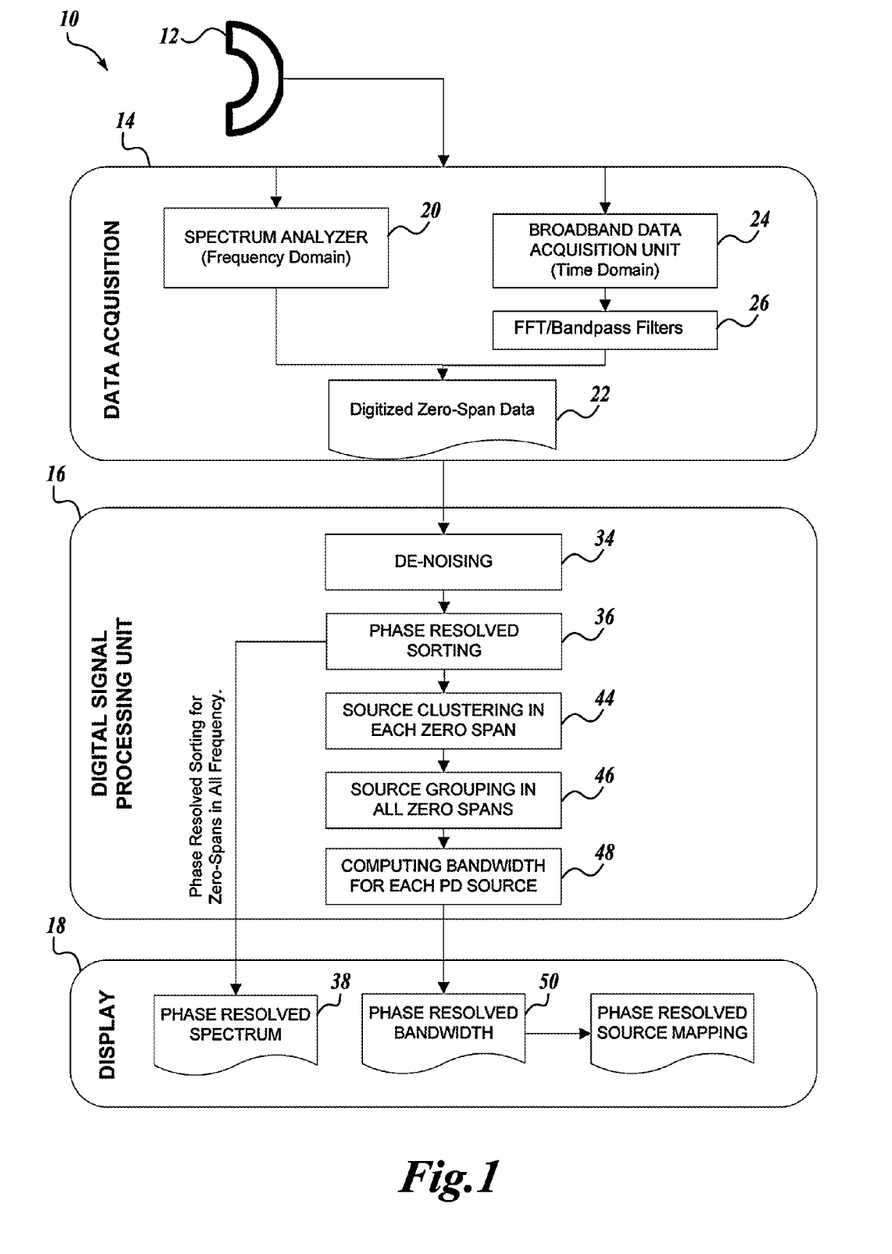
FIG. 1 is a block diagram of components of a system for analyzing and locating partial discharges in accordance with the present invention.

With reference to FIG. 1, such a system 10 uses four main components. A sensor component 12 detects the PDs and generates a corresponding signal (usually an analog electrical signal). A "data acquisition" component 14 receives the signal from the sensor 12 and converts it to a specialized digital format. A digital signal processing component 16 receives the digitized and formatted data from the acquisition component, analyzes such data, and generates a corresponding analyzed digital data signal for aspects of the PD that are of interest as recognized by the present invention. A display component 18 receives the analyzed data stream from the processing component and actuates one or more displays from which characteristics of the PD can be identified.

Since the bandwidth of a PD at its source is wide (up to the GHz range) and since the bandwidth of the PD signal at a measurement location is an important factor in determining the distance from the PD origin point to the measuring location, a sensor 12 used in the present invention preferably is a broadband PD sensor. One example is a capacitive-coupled sensor of the type described in commonly owned U.S. patent application Ser. No. 13/667,952, filed on Nov. 2, 2012. An advantage of such a sensor is the ability to detect and pass signals in the frequency range of 5 KHz to 400 KHz at the low end up to at least several hundred MHz at the upper end. Nevertheless, other sensors can be used which provide a signal convertible to a good representation of PD pulses of the electrical equipment under test. See for example:

"Fundamental Limitations in the Measurement of Corona and Partial Discharge," *IEEE Transactions on Electrical Insulation*, Vol. EI-17, No. 2, April 1982;

"Partial discharge detection in cables using VHF capacitive Couplers," IEEE Transactions on Dielectrics and Electrical Insulation, Vol. 10, No. 2, April 2003;

and the references cited therein.

The signal from the sensor 12, which contains PD pulse information, is fed to the data acquisition component 14. In FIG. 1, two alternative paths are shown for the signal from the sensor 12. The left path leads to a spectrum analyzer 20 of known design. Typically, a spectrum analyzer measures the frequency spectrum of an input signal, and the display will indicate the magnitude of the signal in a band of frequencies selected by the user (identified as "full scan" or "frequency scan" mode of operation of the spectrum analyzer). Some spectrum analyzers also can be set to operate in an alternative "zero span" mode for which the output is quite different, namely, magnitude at a specific center frequency. "Full scan" is a frequency domain measurement, but a "zero span" output actually is a time domain representation. In practice, many known spectrum analyzers with a zero span capability can be set to obtain a series of zero spans in a frequency range. For use in the present invention, as represented at box 22, the digitized zero span data is selected as the output of the data acquisition part. The frequency range can approximate the effective bandwidth of the sensor, and in a representative implementation the range can be 1 to 200 MHz with 3 to 5 MHz steps. Many such analyzers are known in the art, including various analyzers available from Agilent Technologies, headquartered in Santa Clara, Calif.

Still referring to FIG. 1, equivalent digitized zero span data represented at box 22 could also be obtained by a time domain broadband data acquisition unit similar to an oscilloscope. In that case, the time domain device would have to be capable of collecting broadband data, and the zero spans could be generated either by fast Fourier transform, or by digital bandpass filters with center frequencies at the desired steps throughout the frequency spectrum of interest. In FIG. 1, the time domain device is represented at 24 and the transform/filter part is represented at 26. Regardless of the data acquisition system used, the result important for the present invention is the use of digitized zero span data represented at 22.

Example (Data Acquisition)

Figure 2:
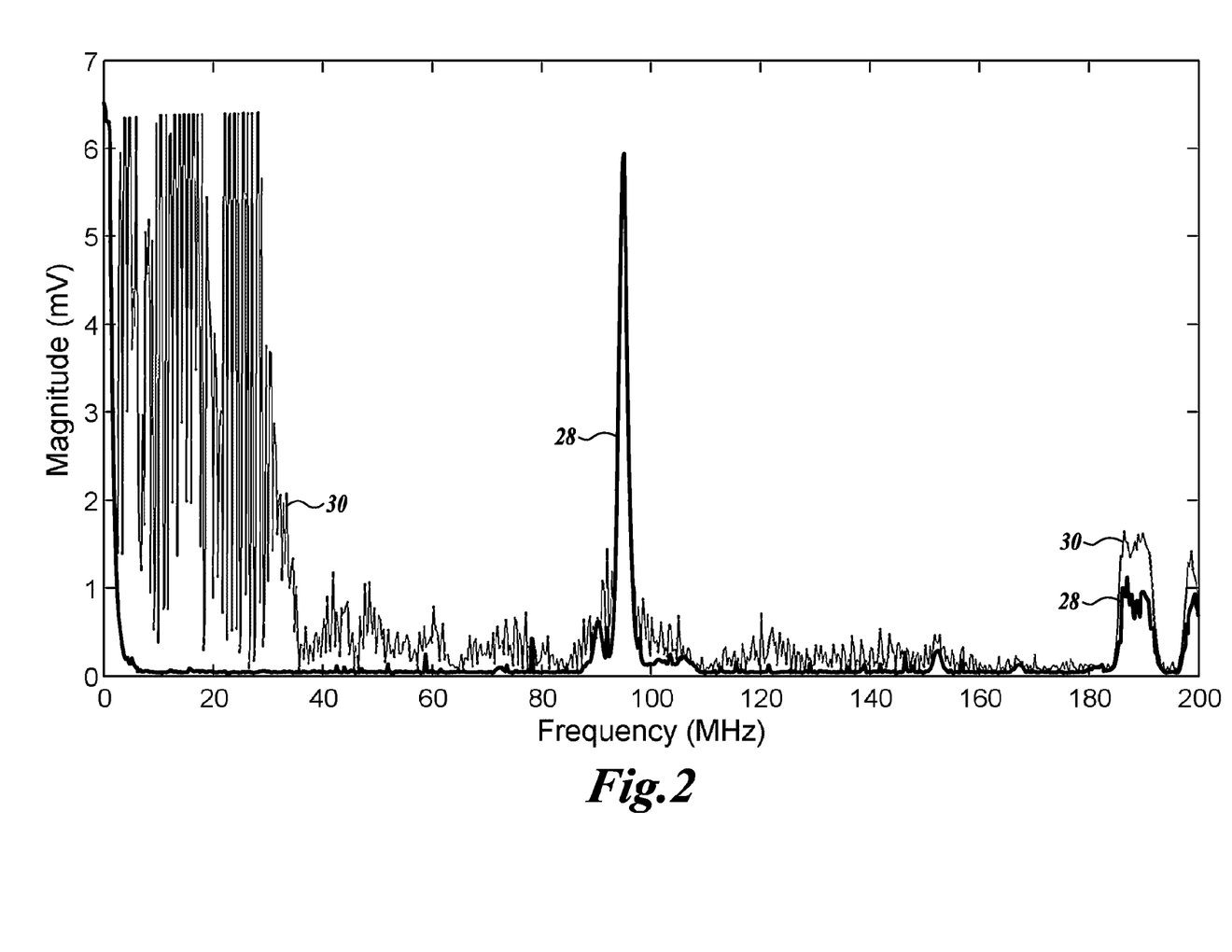
FIG. 2 is a graph representing a full scan output of a spectrum analyzer for which the front end input was a PD signal of the general type with which the present invention is used.
Figure 3:
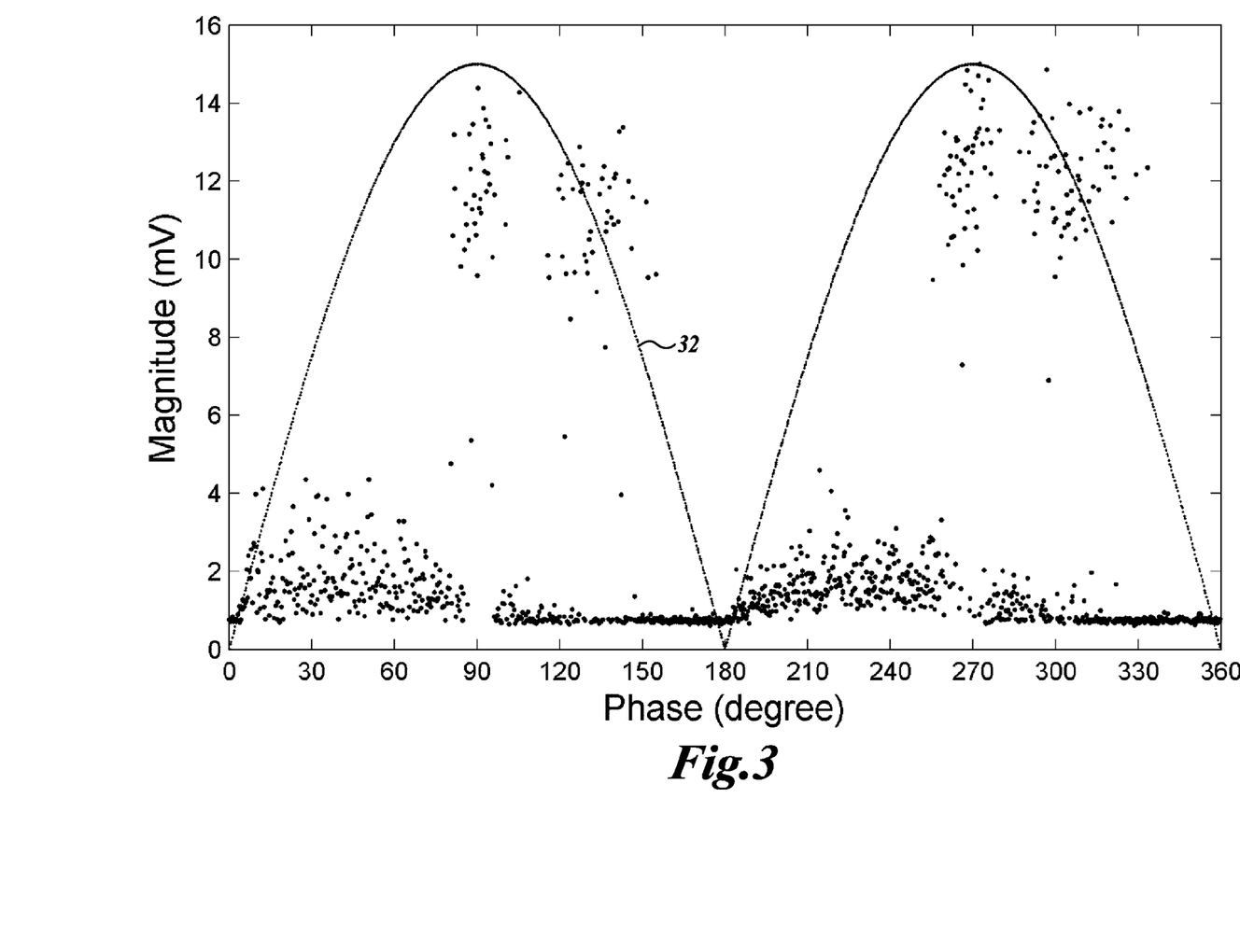
FIG. 3 is a graph representing a modified form of zero span output of a spectrum analyzer for which the front end input was a PD signal of the general type with which the present invention is used.

A broadband capacitive sensor was used in PD measurements carried out on a 425-foot long 28 Kv XLPE power cable with 750 kcmil copper conductor laid out from one manhole to another. Each end of the cable was terminated by a T-body connector. The broadband capacitive sensor was placed over the cable jacket 3 feet away from the T-body connector in one manhole. A low noise preamplifier with a gain of 24 dB was interposed between the capacitive sensor and an Agilent 4403 spectrum analyzer. FIG. 2 is a representation of the full scan output from the analyzer in the frequency mode, including a fast sweep (bold line 28 in the drawing, sweep time 5 milliseconds) and a cumulative slow sweep (fine line 30 in the drawing, sweep time 2 seconds and accumulated by 5 sweeps). The fast sweep (bold) in the full scan mode shows only the baseline of the measuring system and the stationary noise, which contains a spike at around 98 MHz due to an ambient signal from an FM radio station, and another spike due to a digital TV signal at around 187 megahertz (video carrier) and 192 megahertz (audio carrier). The slow sweep (fine line) includes all signals presented to the sensor and cannot distinguish the types of the measured signals. In the prominent spike at about 98 megahertz, the fine line is consumed in the bold line representation. FIG. 3 is a representation of a plot obtained from use of the zero span mode of the analyzer. The vertical axis indicates magnitude, while the horizontal axis has been converted from time to phase and accumulating 60 power cycles of data. The reference line 32 represents the power cycle and the dots show the zero span data. Plots of this type have been used to detect intensity of PD activity.

Returning to FIG. 1, the digitized zero span data is fed to the digital signal processing unit 16 which typically will be a general purpose computer (desktop, laptop, and so on) with appropriate programming including, in the preferred embodiment, numeric processing, data analysis and visualization, and programming and algorithm development capabilities. MATLAB™ software available from The MathWorks, Inc., headquartered in Natick, Mass., provides appropriate tools. The digital processing unit could also be a special purpose computing device programmed for the specific functions described herein. The first step in data processing is de-noising (box 34) to remove irrelevant data and non-PD signals. Since zero spans are actually time domain data, there are many published de-noising methods available to remove the noise, such as a statistical threshold method, height distribution analysis, transformation methods, and so on. The de-noised signals are considered as PD signals only.

The next step is phase-resolved sorting, represented at box 36. In accordance with the present invention, the phase-resolved zero spans are sorted by frequency over the measuring frequency range. This information (equivalent to a frequency domain representation at each phase) is conveyed to the display 18 for presentation in 3D format (represented at box 38 in FIG. 1), an example of which is shown in FIG. 4.

Example (Phase Resolved Spectrum)

Figure 4:
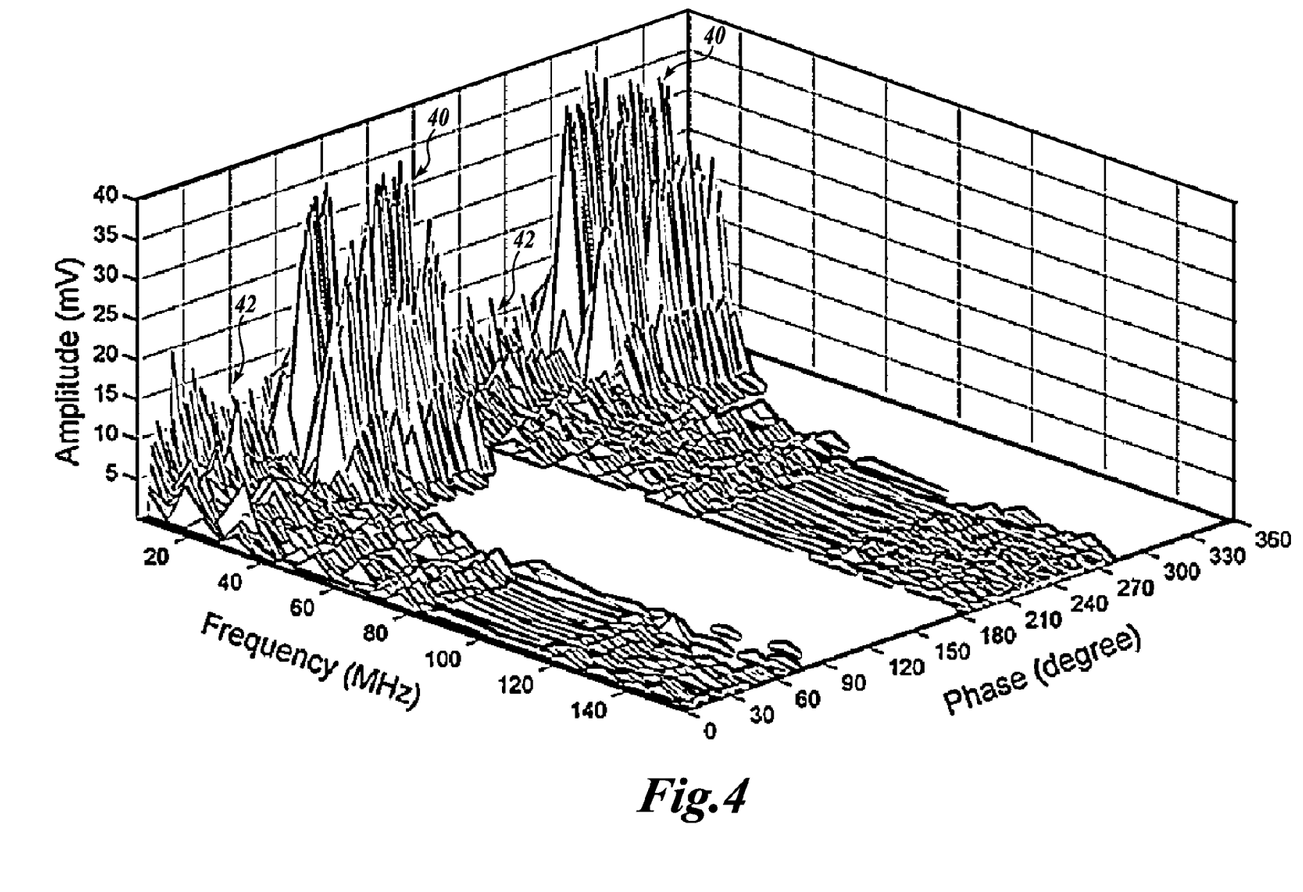
FIG. 4 is a graphic representation of a display of processed PD signal data ("phase resolved spectrum") that can be obtained in accordance with the present invention.

In FIG. 4, the vertical axis represents amplitude for the signals characterized by the graphs of FIG. 1 and FIG. 2. One horizontal axis represents phase and the other horizontal axis represents frequency. In this example, de-noising included removing information from 88 MHz to 116 MHz to avoid the strong FM radio station noise. The plot clearly shows two types of PD signals with quite different spectrums and widely differing bandwidths, which for the purposes of this application can be called "Type A" and "Type B." The signals between 0 and 90 degrees recur between 180 and 270 degrees. The higher amplitude spikes 40 (Type A) have a bandwidth in the neighborhood of 45 MHz and the lower amplitude spikes 42 (Type B) have a bandwidth in the neighborhood of 156 MHZ.

The spectrum is important in PD diagnosis, particularly for power cables, because the measured PD frequency bandwidth is determined by the signal propagation distance, due to attenuation as the pulse travels along the cable. See, for example:

"Propagation of Partial Discharge Pulses in Shielded Power Cable," 1992 *Annual Report of the Conference on Electrical Insulation and Dielectric Phenomena*, National Academy of Science, Washington, D.C., pp. 275-280;

"High Frequency Signal Propagation in Solid Dielectric Tape Shielded Power Cables," *IEEE Transactions on Power Delivery*, Vol. 26 (3), July 2011, pp. 1793-1802;

"Partial Discharge Pulse Propagation in Shielded Power Cable and Implications for Detection Sensitivity," *IEEE Electrical Insulation Magazine*, Vol. 23 (6), November/December 1993, pp. 5-10.

and the references cited therein.

In a field test where there are more than one PD source as well as various noise sources, the frequency spectrum obtained from a full scan is the mixture of all presenting signals, in which the bandwidth of each individual type of PD cannot be recognized. In the present invention, different types of signals are readily identifiable, and the respective bandwidths can be measured.

Data from phase-resolved sorting (box 36 of FIG. 1) can be used to recognize the PD types and cluster the PD data by each discharging type in each zero span (box 44). In a representative implementation, a fuzzy clustering with Subtractive Clustering Method (SCM) can be used to find the cluster centers for discharges in each zero span. See, for example:

Matlab Help Document, "Subtractive Clustering," Matlab R2011b (7.13.0.564);

"Fuzzy Model Identification Based on Cluster Estimation," *Journal of Intelligent and Fuzzy Systems*, Vol. 2 (3), September 1994, pp. 367-378.

The same type of discharge is grouped for all zero spans (box 46). Each zero span will have the identical phase reference, and each type of discharge will have the same or similar clustering center in every zero span. Using the SCM and the nearest neighbor algorithm again for the clustering centers in all the zero spans will categorize the same type of discharges. The bandwidth for each discharge type can be calculated (box 48) and used to generate a phase resolved bandwidth display, such as is shown in FIG. 5 (and represented at box 50).

Example (Clustering, Bandwidth Display)

With the above processes, the zero spans measured from the frequency domain were classified into groups by the discharge types, and each group has a number of zero spans at various frequencies, from which the bandwidth of a certain type of discharge can be observed by comparing the maximum PD magnitude as a function of frequency. Each group of the classified zero spans was then merged together and plotted with phase reference at its bandwidth. The result is shown in FIG. 5 which shows the bandwidths for the two different types of discharges identified from the data represented in FIG. 4. One type has a bandwidth of about 35 megahertz; whereas, the other type has a bandwidth of about 156 megahertz.

Figure 5:
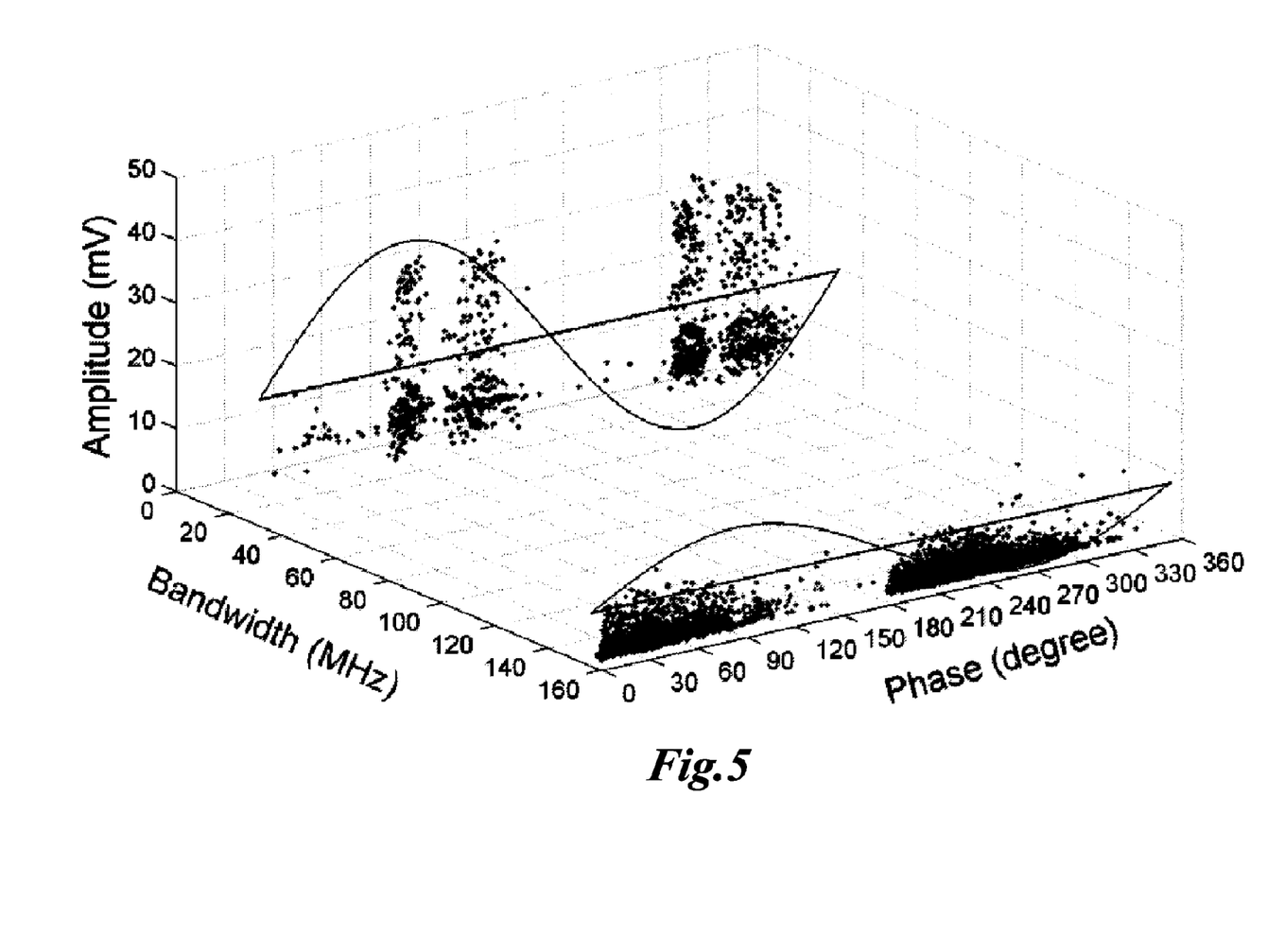
FIG. 5 is a graphic representation of another display of processed PD signal data ("phase resolved bandwidth") that can be obtained in accordance with the present invention.

The bandwidth plot of the PD phase resolved spectrum shown in FIG. 5 can be converted to a PD mapping for the diagnosis of power cables by illustrating the PD activities as a function of defect location. The measured bandwidth of a PD pulse is determined mainly by the signal propagation distance as well as the cable ground structure. Assuming the initial PD pulse is Gaussian with a pulse width of 2.36 σ (full width at its half maximum, FWHM) which is typically a few ns or sub-ns in the solid dielectric of a shielded power cable, the −6 dB bandwidth of that PD pulse at its inception is a few hundreds of MHz. After propagating for a distance of L in a shielded power cable, the PD pulse is attenuated and the bandwidth of the propagated pulse is derived in $$BW(L) = \frac{-\alpha L + \sqrt{\alpha^2 L^2 + 2\sigma^2 \ln(2)}}{2\pi \sigma^2} \quad (1)$$

where α is the attenuation constant for the shielded power cable. This equation is based on the assumption that the high frequency attenuation in shielded power cable (in dB) is approximately a linear function with frequency, which is true for most of the cable structures with solid metallic sheath or neutral wires. However, in some circumstances, i.e., in a tape shielded cable where the copper tape is corroded so that the sheath current has to spiral down the tape which generates significant axial magnetic field in the cable insulation, the high frequency attenuation is no longer a linear function of frequency but needs to be modified by adding another term quadratic in frequency. With the measured PD bandwidth, the location of the defect away from the sensor position could be estimated with $$L(BW) = \frac{\ln(2)}{2\pi\alpha} \cdot \frac{1}{BW} - \frac{\pi\sigma^2}{\alpha} \cdot BW \quad (2)$$

Example (Phase Resolved Mapping)

Figure 6:
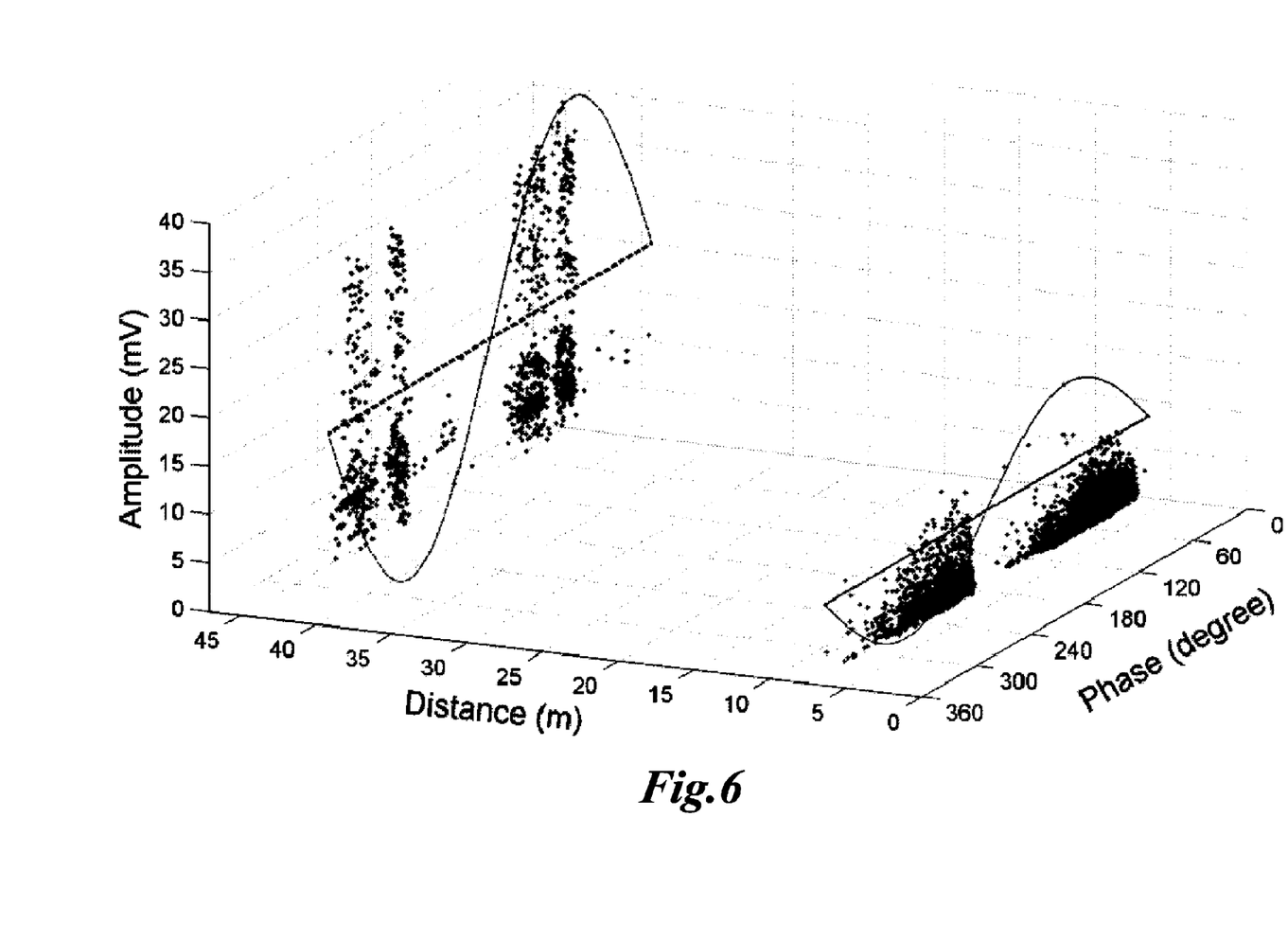
FIG. 6 is a graphic representation of another display of processed PD signal data ("phase resolved mapping") that can be obtained in accordance with the present invention.

The bandwidth in FIG. 5 is converted to the PD inception to sensor distance with Eq. 2, as shown in FIG. 6. For the PD pulses with a higher bandwidth (nearer to the sensor) the data indicate an origin less than 5 m away from the sensor position. The origin of this higher bandwidth discharge was traced to the nearby T-body connector. The tracking discharges with a smaller bandwidth (about 35 MHz) are indicated to be about 40 m away from the sensor position if this PD source is within the cable. The lower bandwidth tracking discharges were traced to external tracking signals from components on a power pole nearby.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method for locating defects that degrade a dielectric of an electrical system comprising:
   (1) acquiring a sensor signal representative of a partial discharge (PD) in the electrical system;
   (2) determining a series of digitized zero span data of the sensor signal at each frequency of a corresponding series of frequencies within a frequency range of interest, wherein the zero spans are time domain representations of a power of the sensor signal at frequencies in the frequency range of interest;
   (3) processing the series of digitized zero span data to obtain a phase resolved spectrum signal in three dimensional format that includes an amplitude as a function of a phase and a frequency bandwidth; and
   (4) determining a location of the PD based on the frequency bandwidth of the phase resolved spectrum signal.

2. The method of claim 1, including acquiring the digitized zero span data signal by:
   (1a) receiving an electrical PD signal from a sensor configured and positioned to sense a PD in the electrical system over a measured frequency range; and
   (1b) converting the electrical PD signal to the digitized zero span data signal having digital zero span data for each of the several frequencies in the frequency range of interest.

3. The method of claim 1, including, between steps (2) and (3), de-noising the digitized zero span data signal.

4. The method of claim 1, including using the phase resolved spectrum signal to actuate a display in three dimensional format including dimensions of amplitude, phase and frequency for each of the several frequencies in the frequency range of interest.

5. The method of claim 1, including, following step (3): automatically identifying one or more types of PDs represented in the phase resolved spectrum signal, and automatically computing the frequency bandwidth for each of said one or more types of PDs.

6. The method of claim 1, wherein the digital zero span data for each of the series of frequencies with adjacent frequencies is separated by a uniform frequency amount over the entire frequency range of interest.

7. The method of claim 1 wherein the location (L) of the PD is determined based on:

$$L(BW) = \frac{\ln(2)}{2\pi\alpha} \cdot \frac{1}{BW} - \frac{\pi\sigma^2}{\alpha} \cdot BW$$

where $\alpha$ is an attenuation constant for the electrical system, and BW is the frequency bandwidth representative of the PD in the electrical system.

8. The method of claim 1 wherein the electrical system is a shielded power cable.

9. The method of claim 5, including automatically identifying the one or more types of PDs represented in the phase resolved spectrum signal by source clustering the digital zero span data for each of the several frequencies in the frequency range of interest, followed by automatically source grouping the digital zero span data for each of the one or more types of PDs identified.

10. The method of claim 6, including having digital zero span data for each of the series of frequencies with adjacent frequencies separated by a uniform frequency amount no greater than 5 MHz over the entire frequency range of interest of at least 100 MHz.

11. The method of claim 9, including automatically generating a phase resolved bandwidth display in three dimensional format for the one or more types of PD discharges identified including dimensions of amplitude, phase and bandwidth.

* * * * *